United States Patent
Labayen De Inza et al.

(10) Patent No.: US 9,764,531 B2
(45) Date of Patent: Sep. 19, 2017

(54) METHOD FOR PRODUCING AN ELECTRONIC COMPONENT OF SANDWICH-LIKE CONSTRUCTION, ELECTRONIC COMPONENT, DETECTOR ELEMENT AND RADIATION DETECTOR

(71) Applicant: SIEMENS AKTIENGESELLSCHAFT, Munich (DE)

(72) Inventors: Miguel Labayen De Inza, Forchheim (DE); Markus Sicker, Hoechstadt/Aisch (DE); Jan Wrege, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 718 days.

(21) Appl. No.: 14/091,461

(22) Filed: Nov. 27, 2013

(65) Prior Publication Data

US 2014/0154473 A1 Jun. 5, 2014

(30) Foreign Application Priority Data

Nov. 30, 2012 (DE) .................. 10 2012 221 988

(51) Int. Cl.
*B32B 7/12* (2006.01)
*B32B 7/14* (2006.01)
(Continued)

(52) U.S. Cl.
CPC .................. *B32B 7/12* (2013.01); *B32B 7/14* (2013.01); *G01T 1/16* (2013.01); *G01T 1/20* (2013.01);
(Continued)

(58) Field of Classification Search
CPC .... B32B 7/12; B32B 7/14; B32B 3/30; G01T 1/16; G01T 1/20; G01T 1/2018; H01L 31/115; Y10T 428/24562
See application file for complete search history.

(56) References Cited

U.S. PATENT DOCUMENTS

| | | |
|---|---|---|
| 2005/0074702 A1 | 4/2005 | Lee |
| 2005/0100727 A1* | 5/2005 | Yokouchi .................. B32B 3/10 428/317.1 |

(Continued)

FOREIGN PATENT DOCUMENTS

| | | |
|---|---|---|
| DE | 19604081 A1 | 8/1997 |
| DE | 102006053211 A1 i | 5/2008 |

(Continued)

OTHER PUBLICATIONS

Chinese Office Action and English translation thereof dated Sep. 22, 2015.

*Primary Examiner* — Aaron Austin
*Assistant Examiner* — Jasper Saberi
(74) *Attorney, Agent, or Firm* — Harness, Dickey & Pierce P.L.C.

(57) ABSTRACT

A method is disclosed for producing an electronic component including at least two functional layers. One of the functional layers has channels, open towards the other functional layer, which run inwards from one edge of the functional layer. Further, an adhesive which contacts the adjacent functional layers is located in at least one of the channels, and a hardening of the adhesive is effected by introducing UV radiation via the channels. Furthermore an electronic component is also disclosed, including at least two adjacent functional layers adhesively bonded together in sandwich-like fashion, wherein at least one of the functional layers has channels which extend inwards from at least one edge of the functional layer and an adhesive hardened by UV (Continued)

radiation is arranged in the channels. A detector element of a radiation detector including such an electronic component and a radiation detector having such a detector element are also disclosed.

33 Claims, 4 Drawing Sheets

(51) Int. Cl.
| | | |
|---|---|---|
| *G01T 1/16* | | (2006.01) |
| *G01T 1/20* | | (2006.01) |
| *H01L 31/115* | | (2006.01) |
| *B32B 3/30* | | (2006.01) |

(52) U.S. Cl.
CPC .......... *G01T 1/2018* (2013.01); *H01L 31/115* (2013.01); *B32B 3/30* (2013.01); *Y10T 428/24562* (2015.01)

(56) References Cited

U.S. PATENT DOCUMENTS

| | | | |
|---|---|---|---|
| 2007/0181252 A1* | 8/2007 | Bohm | .................. C09J 5/06 156/297 |
| 2007/0194337 A1 | 8/2007 | Kondo | |
| 2008/0100779 A1 | 5/2008 | Choo | |
| 2009/0081464 A1* | 3/2009 | Summersgill | .......... B29C 39/10 428/411.1 |
| 2010/0259616 A1* | 10/2010 | Nakajima | ............ H04N 5/2253 348/148 |
| 2012/0018640 A1* | 1/2012 | Shimizukawa | ........... G01T 1/16 250/354.1 |
| 2012/0132812 A1 | 5/2012 | Fuchs et al. | |
| 2012/0261066 A1* | 10/2012 | Smith | ................ B29C 65/1435 156/275.5 |

FOREIGN PATENT DOCUMENTS

| | | |
|---|---|---|
| DE | 102007010540 A1 | 9/2008 |
| JP | 2012227436 A | 11/2012 |
| WO | WO-2007066110 A1 | 6/2007 |

\* cited by examiner

METHOD FOR PRODUCING AN ELECTRONIC COMPONENT OF SANDWICH-LIKE CONSTRUCTION, ELECTRONIC COMPONENT, DETECTOR ELEMENT AND RADIATION DETECTOR

PRIORITY STATEMENT

The present application hereby claims priority under 35 U.S.C. §119 to German patent application number DE 102012221988.9 filed Nov. 30, 2012, the entire contents of which are hereby incorporated herein by reference.

FIELD

At least one embodiment of the invention relates to a method for producing an electronic component of sandwich-like construction including at least two functional layers adhesively bonded together, and to an electronic component having at least two functional layers adhesively bonded together in sandwich-like fashion.

BACKGROUND

Methods for producing electronic components and such electronic components are generally known. For example, reference is made to the patent application DE 10 2010 062 035 A1 which discloses such a production process for a radiation detector. There an adhesive layer is applied to a first functional layer with the aid of a support frame and said first functional layer is then adhesively bonded with a second functional layer in sandwich-like fashion after removal of a protective film.

If, when employing such a method, the adhesive layer is to be hardened, this can be done when using a suitable adhesive, for example by the application of pressure, elevated temperature or UV radiation. The disadvantage in this situation is the fact that the application of pressure or temperature can result in damage to or changes in properties of the functional layers. If an adhesive has been used which hardens as a result of UV radiation (UV=ultraviolet, UV radiation=light in the ultraviolet wavelength range), the hardening effect would thus continually decrease from the edge of the components towards the interior which means that while the adhesive bonding on the edge side would be well hardened it would however still be soft in more central regions of the adhesive bonding. Similarly, changes in volume could also take place in the adhesive which would result in severe mechanical stresses and associated damage.

SUMMARY

At least one embodiment of the invention is directed to a production process for such electronic components constructed in sandwich-like fashion, wherein the adhesive bonding hardens as evenly as possible and at the same time the smallest possible pressure loads and temperature stresses occur.

Advantageous developments of the invention are the subject of subordinate claims.

The inventors accordingly propose a method, in at least one embodiment, for producing an electronic component of sandwich-like construction including at least two functional layers to be adhesively bonded to one another, the method comprising:

producing a sandwich including at least two functional layers, wherein the functional layers at least partially contact adjacent surfaces and at least one of the functional layers has channels open towards the other functional layer, which channels run inwards from at least one edge of the at least one functional layer, wherein a first adhesive which can be hardened by UV radiation is located in at least one of the channels, which first adhesive contacts the adjacent functional layers, and introducing UV radiation by way of the channels in order to harden the first adhesive.

According to a further aspect of at least one embodiment of the invention, the inventors also propose an electronic component which comprises at least two adjacent functional layers adhesively bonded together with one another in sandwich-like fashion by adhesive. According to at least one embodiment of the invention, the at least two adjacent functional layers are arranged in such a manner that they are at least partially in direct contact; furthermore at least one of the functional layers has a surface facing the adjacent functional layer which forms channels transparent to UV light extending inwards from at least one edge of the functional layer, wherein a first adhesive which bonds the functional layers to one another is an adhesive hardened by UV radiation, and said first adhesive is arranged exclusively in at least one of the channels.

BRIEF DESCRIPTION OF THE DRAWINGS

The invention will be described in detail in the following with reference to the example embodiments with the aid of the figures, wherein only the features necessary for understanding the invention are illustrated.

The following reference characters are used here: 1: electronic component; 2: scintillator layer; 3: readout electronics layer; 4: substrate layer; 5: carrier layer; 6: bump bonding; 7: adhesive; 7.1: adhesive hardening by UV radiation; 7.2: adhesive hardening by thermal treatment; 8: wire connection; 9: channels; 9.1: channel base; 10: UV radiation; T: depth.

In the detailed drawings:

FIG. 1 shows a longitudinal section of an electronic component having functional layers bonded in sandwich-like fashion by adhesive bonding and "bump bonding" in accordance with the prior art;

FIG. 2 shows a schematic illustration of the construction of an electronic component according to the invention having two functional layers arranged in sandwich-like fashion which are bonded by a first adhesive located in channels;

FIG. 3 shows a longitudinal section of an electronic component having two functional layers arranged in sandwich-like fashion which are bonded by a first UV-hardening adhesive located in channels, wherein channels are let into a functional layer;

FIG. 4 shows a longitudinal section of an electronic component having two functional layers arranged in sandwich-like fashion which are bonded by a first UV-hardening adhesive located in channels, wherein channels are created by elevations on the one functional layer;

FIG. 5 shows a top view of an electronic component having channels for the adhesive;

FIG. 6 shows a longitudinal section of an electronic component having four functional layers arranged in sandwich-like fashion, with "bump bonding" between the scintillator layer and the readout electronics layer, and channels for adhesive bonding in the substrate layer and the carrier layer;

FIG. 7 shows a longitudinal section through a channel of an electronic component for UV light introduction having a linearly rising channel base;

FIG. 8 shows a longitudinal section through a channel of an electronic component for UV light introduction having a parabolically rising channel base and FIG. 9 shows a top view of an electronic component having channels for adhesive which are filled in sections with adhesive hardening by UV radiation and adhesive hardening by heat treatment.

DETAILED DESCRIPTION OF THE EXAMPLE EMBODIMENTS

Figure 1:
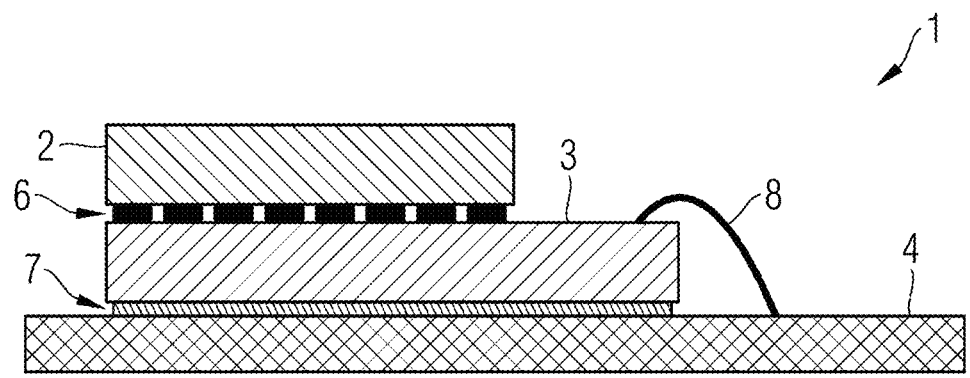

The present invention will be further described in detail in conjunction with the accompanying drawings and embodiments. It should be understood that the particular embodiments described herein are only used to illustrate the present invention but not to limit the present invention.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

The inventors have recognized that the problem of the variable hardening of the adhesive hardening as a result of UV radiation is due primarily to the low depth of penetration of the UV radiation into the gap between the two functional layers to be adhesively bonded. The inventors have furthermore recognized that it is possible to design and produce electronic components constructed in sandwich-like fashion such that when the component is illuminated laterally by UV radiation the UV radiation is distributed significantly better in the adhesive layer lying between the functional layers if gaps or channels are created in the functional layer arranged there on at least one side of the adhesive layer, into which gaps or channels is introduced a first adhesive which hardens as a result of the UV radiation, which means that the UV light can penetrate fully into the interior through the relatively large channels and hardens the adhesive throughout.

In this situation, it has also proven advantageous that it is then possible to dispense with a complete adhesive layer between the two functional layers and a considerably more precise joining together of the functional layers thereby becomes possible. Since the initially soft adhesive layer between the functional layers is not now present, the free surfaces of the functional layers fit together more accurately. As a result of the largely even hardening of the adhesive it is also ensured that on the one hand the holding power of the adhesive is improved and on the other hand that the change in volume of the adhesive which is conditional on the hardening takes place evenly over the entire area of the functional layers. Stresses are thereby avoided and no pressure- and temperature-related stresses occur at the functional layers.

Such a production process is thus particularly suited for electronic components of a radiation detector which has semiconductors sensitive to radiation, in particular semiconductors having a substrate material consisting of CdTe, CdZnTe, CdZnTeSe, CdTeSe, CdMnTe, InP, TlBr2, or HgI2, in particular for quantum-counting radiation detectors, in particular for CT systems. In the case of such components, the semiconductor radiation detectors are for the most part adhesively bonded to a semiconductor readout and processor substrate, an ASIC for example. The resulting hybrid assembly is in turn adhesively bonded onto a substrate and the entire unit is connected with a carrier.

In order to create the gaps or channels according to at least one embodiment of the invention through which UV radiation is directed from the edge to the interior of the area of the functional layers to be adhesively bonded either depressions can be created in an otherwise smooth area, or elevations can be formed on a smooth area such that a depression is formed in each case between the elevations.

Furthermore, the distribution of the incident UV light can be configured particularly favorably if the surfaces of the channels are designed to be at least partially mirrored. This means that the light entering the channels can enter the adhesive layer arranged thereabove or therebelow particularly well and harden said adhesive layer.

The inventors have also recognized that a further favorable embodiment of the production method according to the invention can be created through a combination of an adhesive bonding of two functional layers using UV-hardening adhesive and an adhesive bonding using thermally hardening adhesive. To this end, both a UV-hardening first adhesive and also a second heat-hardening adhesive are filled into the channels. This can be done as appropriate in separate channels or also in parallel or in sections in the same channels.

In this manner, after the functional layers have been brought together in accurately fitting fashion the UV-hardening portion of the adhesive can initially be hardened by means of UV radiation, whereby a rapid fixing of the functional layers is achieved. The functional layers fixed with respect to one another can then be easily subjected to gentle thermal treatment by which the remaining thermally hardenable adhesive is hardened. Since such a hardening no longer necessarily requires devices in order to fix the functional layers, such a hardening can take a relatively long time and thus take place in a gentle fashion without occupying special devices and thus not requiring any special production facilities.

It should also be noted that the method according to at least one embodiment of the invention for adhesively bonding at least two functional layers and their configuration can also be used in combination with elements or functional layers connected by means of "bump bonding". For example, a first radiation-detecting functional layer can be connected with a second readout functional layer by way of a "bump bonding" method while the second functional layer is connected with a third functional layer, for example a substrate layer, by way of adhesive bonding with UV-hardening adhesive.

In this case the channels are preferably located in the third functional layer. In this situation the third functional layer can additionally be adhesively bonded on a fourth functional layer, for example a carrier layer. By preference, said adhesive bonding can also be implemented by way of a UV-hardening adhesive in conjunction with correspondingly arranged channels in the third and/or fourth functional layer.

The adhesive bondings using UV-hardening adhesive can also be supplemented by adhesive bondings using thermally hardening adhesive, in which case it is also possible to firstly use UV-hardening adhesive to implement adhesive bondings following one another for all the functional layers to be adhesively bonded and in a joint step to subsequently carry out the thermal hardening of the thermally hardening adhesive additionally used with regard to all the adhesive bondings.

The inventors accordingly propose a method, in at least one embodiment, for producing an electronic component of sandwich-like construction including at least two functional layers to be adhesively bonded to one another, the method comprising:

producing a sandwich including at least two functional layers, wherein the functional layers at least partially contact adjacent surfaces and at least one of the functional layers has channels open towards the other functional layer, which channels run inwards from at least one edge of the at least one functional layer, wherein a first adhesive which can be hardened by UV radiation is located in at least one of the channels, which first adhesive contacts the adjacent functional layers, and introducing UV radiation by way of the channels in order to harden the first adhesive.

By using such a method, it is possible to ensure that surface areas which are covered on both sides in sandwich-like fashion by nontransparent functional layers and are not arranged at the edge nevertheless also receive sufficient UV radiation in order to ensure even hardening of the adhesive.

Open channels in the context of this publication are any depressions in surfaces which are open on their longitudinal side. By preference, the channels should be designed as transparent to UV light at least in the regions in which the first adhesive is present. Transparent to UV light is understood to mean that the channels should be designed in such a manner that UV radiation is able to penetrate at least from one edge side through an edge-side opening in the channel into the channel. This essentially means that the form of the channel should as a general rule be largely linear. However, curvatures can also be compensated for by way of appropriate mirroring. It is important in this situation that UV radiation is able to penetrate from one end or start of a channel sufficiently far into the channel that the first adhesive located in the channel can be hardened by the UV light penetrating by way of the channel.

While the method described above is also suitable for creating an adhesive bonding between two functional layers exclusively using UV-hardening adhesive, under certain circumstances it can be even more favorable if in addition an adhesive is used which hardens thermally and to this end the adhesive bonding is implemented in such a manner that:

a second, heat hardenable adhesive which contacts the adjacent functional layers is located in at least one channel, and after the first adhesive has hardened a heat treatment is carried out to harden the second adhesive.

When using a first and a second adhesive, it can be favorable to insert the adhesives separately into separate channels such that at least two channels each have exclusively the first adhesive or exclusively the second adhesive. This embodiment avoids any mixing of the two adhesive types and prevents undesired chemical reactions from taking place between them.

Alternatively or also in combination it is however also possible that at least one channel has both the first adhesive and also the second adhesive. To this end, two beads of different adhesive can for example be inserted into a channel in parallel or alternately in sections in each case.

In order to introduce the adhesive, special application devices can be used which for example insert the first adhesive and/or the second adhesive as a bead into the channel. For example, a two-chamber applicator can be employed here which uses powered pistons coupled to one another to simultaneously produce two adhesive beads, the relative volume of which with respect to one another is clearly defined.

According to the method according to at least one embodiment of the invention, the insertion of the adhesive or adhesives can take place at different, the same or separate points in time and states of the sandwich construction of the functional layers. It is thus possible that the first adhesive and/or the second adhesive are/is inserted into the channel before the sandwich consisting of first functional layer and second functional layer is formed. In this connection at least one of the adhesives is applied into the channel which is open on its longitudinal side before the first and second functional layers are placed on top of one another in sandwich-like fashion. The advantage of this variant consists in the fact that the open channels are easily accessible for the application; however, when apportioning the adhesive it is necessary to ensure that exactly the correct quantity is applied in order on the one hand to sufficiently fill the channel and on the other hand to avoid a lateral escape of adhesive from the channels so that no adhesive penetrates between the surfaces, lying on top of one another, of the functional layers.

Alternatively, the sandwich including first and second functional layers can also be formed first and then the first adhesive and/or the second adhesive are inserted into one or more channels—now closed on the longitudinal side. With regard to this variant it is advantageous that the functional layers are already lying on top of one another which means that the adhesive to be introduced is no longer able to penetrate between the surfaces of the functional layers lying directly against one another. Excessive applied adhesive can escape from the terminal openings of the channels which are otherwise now closed.

A combination of both methods is also possible, wherein in particularly advantageous fashion the first adhesive is applied into at least one open channel, then the sandwich is formed, the first adhesive is hardened by UV radiation and then the thermally hardening second adhesive is injected into the now closed, available channels.

A needle on an application device for example can be used for inserting the first adhesive and/or the second adhesive. To this end the needle can initially be introduced into the channel or channels and be withdrawn during the application of adhesive.

If such a combined adhesive bonding is used, then it can be particularly beneficial to the production process if in the case of an adhesive bonding of more than two functional layers the hardening of all the second adhesives by heat takes place only after all the functional layers have been fixed with the aid of the UV-hardening first adhesive layers. In other words, fixing of the functional layers among one another is firstly performed with the aid of UV-hardening adhesive and subsequently the entire component as a whole is subjected to simultaneous thermal hardening of multiple adhesive layers in a single step.

With regard to at least one embodiment of the method presented here, at least one of the following layers from the following list can be used as a functional layer: scintillator layer, photosensor layer, readout electronics layer, substrate layer, carrier layer.

According to a further aspect of at least one embodiment of the invention, the inventors also propose an electronic component which comprises at least two adjacent functional layers adhesively bonded together with one another in sandwich-like fashion by adhesive. According to at least one embodiment of the invention, the at least two adjacent functional layers are arranged in such a manner that they are at least partially in direct contact; furthermore at least one of the functional layers has a surface facing the adjacent functional layer which forms channels transparent to UV light extending inwards from at least one edge of the functional layer, wherein a first adhesive which bonds the functional layers to one another is an adhesive hardened by UV radiation, and said first adhesive is arranged exclusively in at least one of the channels.

It is favorable if in the case of such an electronic component at least one part of the channels is formed by a depression or an incision into the functional layer. Furthermore, at least one part of the channels can also be formed by elevations on the functional layer.

To facilitate better distribution of the UV light through the channels at least one channel can have a mirrored surface and/or a depth reducing inwards from the edge of the functional layer.

It is moreover advantageous if in the case of such an electronic component a second adhesive hardened by heat is arranged in at least one channel and/or both the first adhesive and also the/a second adhesive which is hardened by heat are arranged in at least one channel. By this means it is possible to initially fix the functional layers relative to one another using UV-hardening adhesive and thereafter to carry out a hardening process for a heat-hardening adhesive.

The scope of at least one embodiment of the invention includes in particular electronic components in which at least one of the two functional layers adhesively bonded together is taken from the following list of functional layers: scintillator layer, photosensor layer, readout electronics layer, substrate layer, carrier layer.

Furthermore, with regard to the electronic component, the first functional layer can advantageously be a readout electronics layer and the second functional layer a substrate layer, in which case the channels are arranged in the substrate layer. In this situation a carrier layer can additionally be arranged beneath the substrate layer, in which case the channels run in the carrier layer and/or the substrate layer.

The scope of at least one embodiment of the invention also includes the electronic component being a component part of a radiation detector.

It is in particular favorable if such types of electronic components are produced using the method in accordance with at least one embodiment of the invention described above.

The scope of at least one embodiment of the invention furthermore includes a detector element of a radiation detector, which has an electronic component having the features described above, and also a radiation detector, in particular a radiation detector of a CT system, having a plurality of detector elements, which has at least one detector element according to at least one embodiment of the invention.

FIG. 1 shows a longitudinal section of an electronic component 1 in accordance with the known prior art having functional layers bonded in sandwich-like fashion by adhesive bonding and "bump bonding". Specifically this is the electronic component 1 of a quantum-counting detector element of a CT detector. The functional layers shown from top to bottom are a scintillator layer 2 followed by a readout electronics layer 3, which are bonded to one another by means of "bump bonding". Then follows a substrate layer 4 which is adhesively bonded with the readout electronics layer by means of a layer of adhesive 7. Furthermore, the readout electronics layer 3 is connected by way of exposed wire connections 8 with conductor paths (not illustrated in detail) on the substrate layer 4.

According to an embodiment of the invention, the adhesive 7 should be formed at least partially by an adhesive 7.1 hardenable by UV radiation, in which case UV radiation is also directed from the edge through channels to regions of the adhesive 7.1 distant from the edge in order to also be able to produce hardening in regions which are located in the interior of the sandwich formed by the functional layers.

Figure 2:
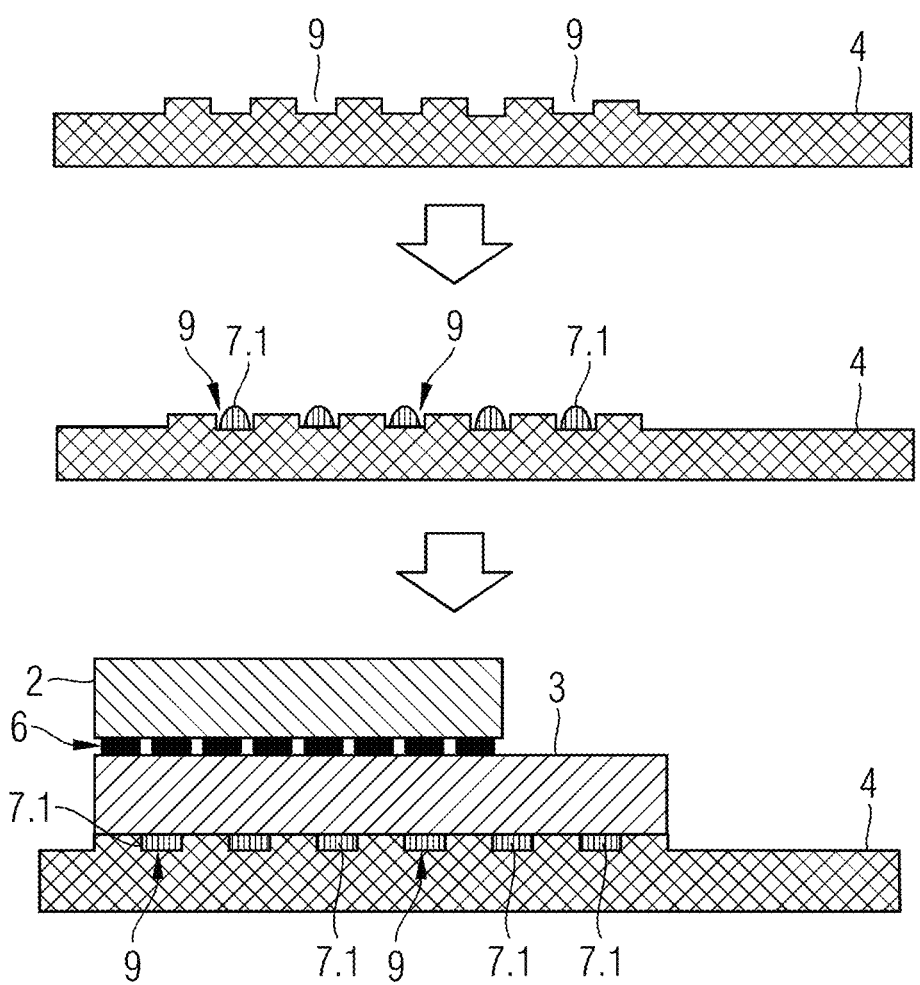

FIG. 2 illustrates by way of example how in a manner according to the invention a sandwich consisting of two functional layers can be produced. To this end the substrate layer 4 shown at the top can be used, which has on its upper side a plurality of channels 9 which are open on one longitudinal side. An adhesive, here a UV-hardening first adhesive 7.1, is inserted into each of said channels 9 in the form of beads. Subsequently the functional layer 3—here a readout electronics layer which is already bonded by means of a "bump bonding" method with a scintillator layer 2—is placed onto the substrate layer, in which case the first adhesive 7.1 is distributed evenly into the channels 9 and can be hardened by the lateral application of UV radiation. The sandwich-like structure of an electronic component shown below in FIG. 2 is produced in this manner.

Figure 3:
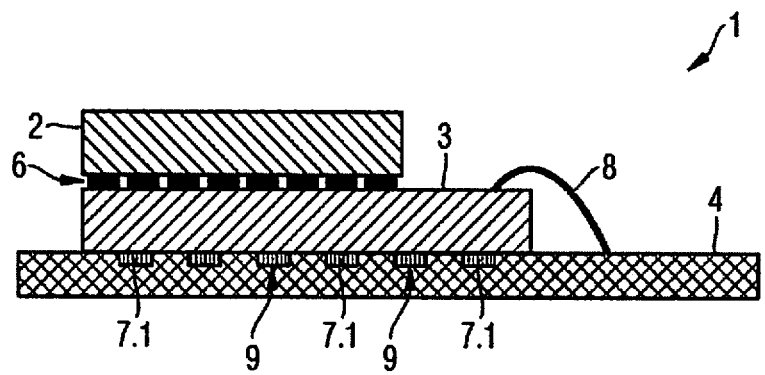
Figure 4:
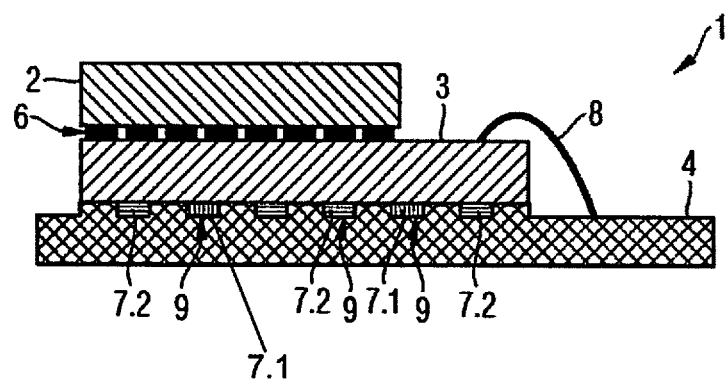

FIGS. 3 and 4 illustrate a longitudinal section of two—in relation to the channels—different variants of such an embodiment of an electronic component 1. FIG. 3 shows an embodiment variant in which the channels 9 have been let into the substrate layer 4, in other words into one of the functional layers. According to the invention however the channels 9 can also be present in both functional layers. In this situation it is for example also possible to insert a first, UV-hardening adhesive into the channels of one functional layer and to insert the second, thermally hardening adhesive into the channels of the other functional layer. In an expedient manner the channels should be arranged such in this situation that when the sandwich has been assembled they are arranged offset to one another.

FIG. 4 shows another variant of the component according to FIG. 2 embodied according to the invention. Here the channels 9 are not formed by a depression in the substrate material but elevations are applied on the substrate layer 4, between which the channels 9 are formed. By preference such channels 9 are linear in form, however curvature of the channels 9 can also be enabled by using appropriate wall mirroring or by appropriately filling the channels 9 with light-conducting material or by means of appropriate mirroring of the channel walls. A further feature which is illustrated in FIG. 4 relates to the adhesive used in the channels. Here two channels 9 are filled with a first, UV-hardening adhesive 7.1 while the remaining channels 9 are filled with a second, thermally hardening adhesive 7.2. In this manner the functional layers 3 and 4 can initially be fixed relative to one another with the aid of the UV-hardened adhesive 7.1 and only then be subjected to heat treatment without further separate fixings in order to harden the second adhesive 7.2.

Figure 5:
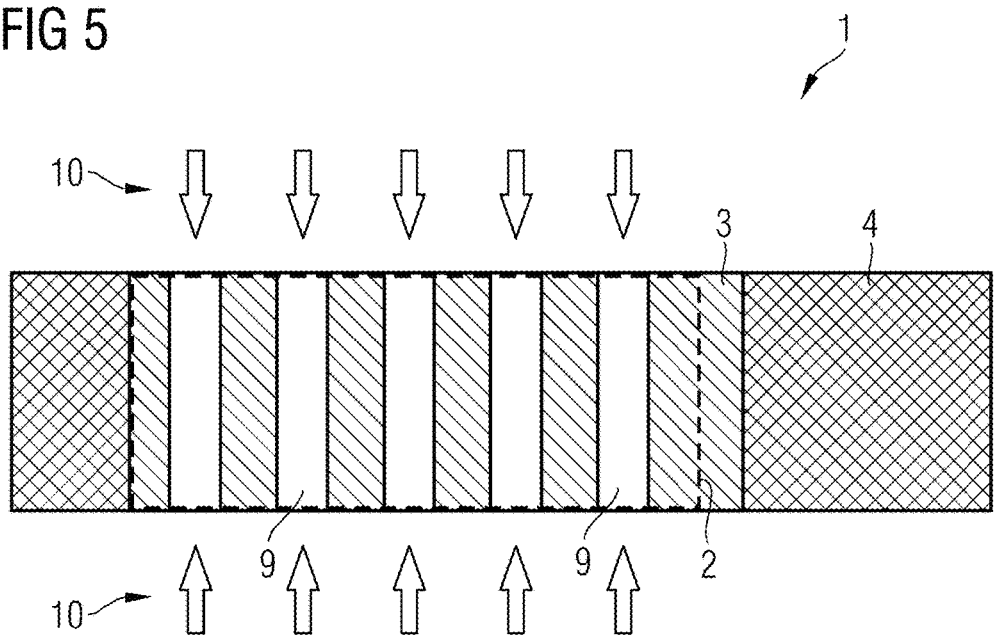

An example of the distribution of the channels 9 over the functional layer is illustrated in FIG. 5. FIG. 5 shows a top view of an electronic component having channels 9 arranged in the region of the adhesive layer. The laterally incident UV radiation 10 is directed along the channels 9 through the adhesive to the inner regions of the sandwich where it hardens the adhesive.

If such channels were not present, an adhesive layer would be required between the two functional layers, which would mean that on the one hand the dimensional stability of the sandwich in respect of its overall thickness would be compromised and on the other hand it would not be possible to ensure that internally located regions of said adhesive layer harden sufficiently as a result of UV treatment.

Figure 6:
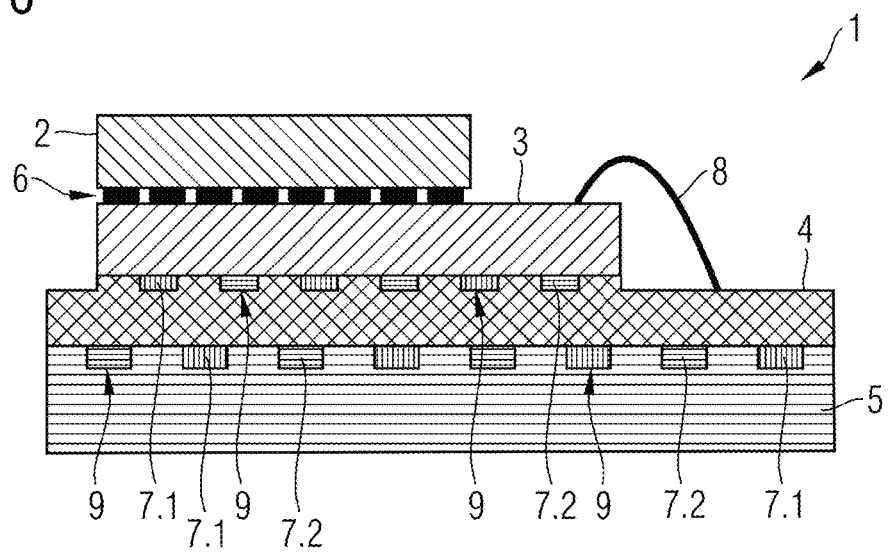

A further example form of embodiment of an electronic component 1 according to an embodiment of the invention is illustrated in FIG. 6 which shows a longitudinal section having four functional layers arranged in sandwich-like fashion with "bump bonding" between the scintillator layer 2 and the readout electronics layer 3. The readout electronics layer 3 and the substrate layer 4 on the one hand and the substrate layer 4 and the carrier layer 5 on the other hand are bonded by adhesive in the channels 9 according to the invention, a first adhesive 7.1 and a second adhesive 7.2 being used alternately. The electronic component thus corresponds in its upper part to the embodiment from FIG. 4, while additionally in the lower part a carrier layer 5 is adhesively bonded with the substrate layer 4.

Figure 7:
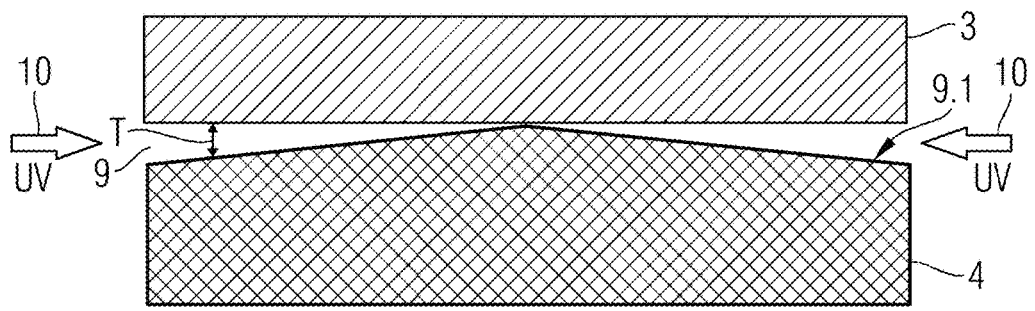
Figure 8:
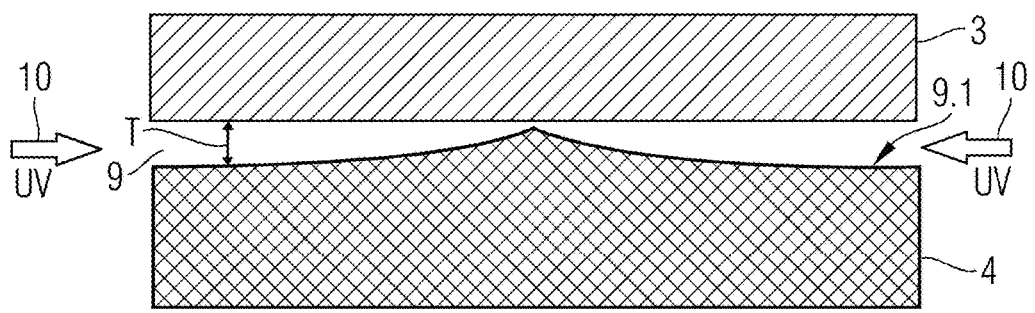

In order to better distribute the UV light introduced by way of the channels 9 it is also proposed according to the invention to at least partially mirror the walls of the channels. It can also be particularly favorable in this situation if the channels 9 have a cross-section which reduces from the edge region towards the interior. For example, as shown in FIG. 7, a linearly rising channel base 9.1 can be used or, as shown in FIG. 8, a curved, preferably parabolically rising, channel base 9.1 can be used. In both variants the depth T of the channel reduces progressively from the outside to the inside. This design serves to prevent the UV light 10 from simply passing through the channel 9 without taking effect in the adhesive.

As already mentioned above, an embodiment of the invention also includes a method and/or an electronic component in which the adhesive bonding with UV-hardening adhesive 7.1 merely serves to initially fix the functional layers to one another. In this situation an adhesive bonding is additionally performed using thermally hardening adhesive 7.2. Instead of filling individual channels 9 throughout with a single type of adhesive in each case or filling one channel with two adhesive types along the entire channel, it is also possible to insert different adhesive in sections into the channels.

Figure 9:
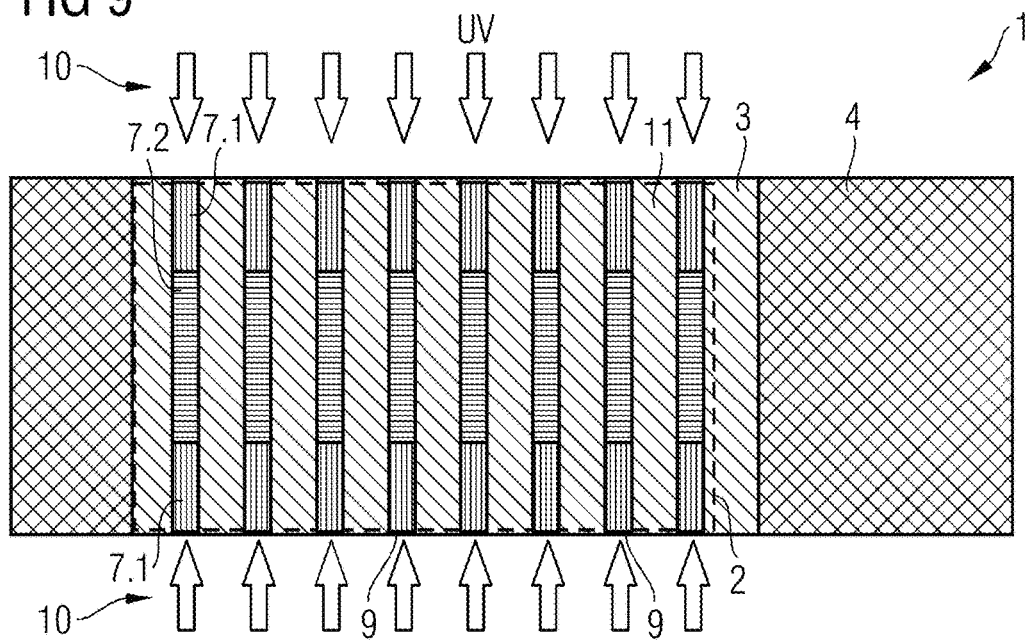

FIG. 9 illustrates a top view of such an embodiment of a component. This figure basically corresponds to the illustration from FIG. 5, however here the channels 9 are in each case filled in the sections located on the outside with a first, UV-hardening adhesive 7.1 and in the sections located on the inside with a second, thermally hardening adhesive 7.2. This ensures that the first adhesive 7.1 is particularly well accessible to the UV radiation and thus hardens particularly quickly and consistently, while the second, thermally hardening adhesive 7.2 arranged on the inside can be hardened by way of gentle thermal treatment, as a result of which the scintillator layer used is not compromised. It is also advantageous here that after the first UV treatment the channels are securely closed and the still soft second adhesive is unable to flow out of the interior regions even if kept in extended intermediate storage. Even as a result of said second adhesive warming up, which as a rule also leads to liquefaction, no adhesive therefore escapes to the outside.

Overall, an embodiment of the invention thus proposes a method for producing an electronic component consisting of at least two functional layers, wherein one of the functional layers has channels open with respect to the other functional layer which run inwards from one edge of the functional layer, and wherein an adhesive is located in at least one of the channels which contacts the adjacent functional layers, and a hardening of the adhesive takes place as a result of introducing UV radiation by way of the channels. Furthermore, an electronic component is also proposed having at least two adjacent functional layers adhesively bonded together in sandwich-like fashion, wherein at least one of the functional layers has channels which extend inwards from at least one edge of the functional layer and an adhesive hardened by UV radiation is arranged in said channels. Finally, an embodiment of the invention also includes a detector element of a radiation detector having such an electronic component and a radiation detector having such a detector element.

Although the invention has been illustrated and described in detail by means of the preferred exemplary embodiment, the invention is not restricted by the disclosed examples and other variations can be derived therefrom by the person skilled in the art without departing from the scope of protection of the invention.

What is claimed is:

1. An electronic component, comprising: at least two adjacent functional layers adhesively bonded together with one another in sandwich-like fashion, wherein the at least two adjacent functional layers are at least partially in direct contact, at least one of the at least two functional layers includes a surface, facing an adjacent one of the at least two functional layers, which forms channels transparent to UV light extending from at least one edge region to an opposing edge region of the at least one of the functional layers; a first adhesive, to bond the at least two functional layers to one another, hardenable by UV radiation, said first adhesive being arranged exclusively in the channels; and wherein an entirety of each channel in which the first adhesive hardenable by UV radiation is arranged comprises a cross section decreasing from the at least one edge region and from the opposing edge region of the at least one functional layer to the middle of the at least one functional layer.

2. The electronic component of claim 1, wherein at least one part of the channels comprises a depression or an incision into the at least one functional layer.

3. The electronic component of claim 1, wherein at least one part of the channels comprises elevations on the at least one functional layer.

4. The electronic component of claim 1, wherein at least one of the channels includes a mirrored surface.

5. The electronic component of claim 1, wherein the at least one channel has a depth reducing inwards from at least one edge, within the edge region, of the at least one functional layer.

6. The electronic component of claim 1, wherein a second adhesive, hardenable by heat, is arranged in at least one channel.

7. The electronic component of claim 6, wherein both the first adhesive and the second adhesive, hardenable by heat, are arranged in at least one channel.

8. The electronic component of claim 1, wherein at least one of the two functional layers adhesively bonded together is taken from the following list of functional layers:
    scintillator layer,
    photosensor layer,
    readout electronics layer,
    substrate layer, and
    carrier layer.

9. The electronic component of claim 1, wherein the first functional layer is a readout electronics layer and the second functional layer is a substrate layer, and wherein the channels are arranged in the substrate layer.

10. The electronic component of claim 9, wherein a carrier layer is additionally arranged beneath the substrate layer, and wherein the channels run in at least one of the carrier layer and the substrate layer.

11. The electronic component of claim 1, wherein the electronic component is a component part of a radiation detector.

12. A detector element of a radiation detector, comprising the electronic component of claim 1.

13. A radiation detector, in particular of a CT system, comprising:
    a plurality of detector elements, at least one of the plurality of detector elements being the detector element of claim 12.

14. A CT system, comprising the radiation detector of claim 13.

15. The electronic component of claim 2, wherein at least one part of the channels is formed by elevations on the at least one functional layer.

16. The electronic component of claim 1, wherein both the first adhesive and a second adhesive, hardenable by heat, are arranged in at least one channel.

17. A method for producing an electronic component of sandwich-like construction including at least two functional layers to be adhesively bonded together as recited in claim 1, the method comprising: producing a sandwich-like structure including at least two functional layers, the at least two functional layers including at least partially contacting adjacent surfaces, at least one of the at least two functional layers including channels open towards another of the at least two functional layers, the channels running from at least one edge region to an opposing edge region of the at least one functional layer, wherein a first adhesive, hardenable by UV radiation, is located in at least one of the channels, the first adhesive contacting the adjacent at least two functional layers, and introducing UV radiation via the channels to harden the first adhesive.

18. The method of claim 17, wherein a second, heat hardenable adhesive which contacts the adjacent at least two functional layers is located in at least one of the channels, the method further comprising:
    carrying out, after the first adhesive has hardened, a heat treatment to harden the second adhesive.

19. The method of claim 18, wherein the at least two channels each have exclusively the first adhesive or exclusively the second adhesive.

20. The method of claim 18, wherein at least one channel has both the first adhesive and the second adhesive.

21. The method of claim 17, wherein the first adhesive is inserted with the aid of an application device as a bead into the channel.

22. The method of claim 20, wherein the first adhesive is inserted with the aid of a multi-chamber application device as parallel beads into the channel.

23. The method of claim 17, wherein the first adhesive is inserted into the channel before the sandwich-like structure including the first functional layer and the second functional layer is formed.

24. The method of claim 17, wherein the first adhesive is inserted into the channel after the sandwich-like structure including the first functional layer and the second functional layer is formed.

25. The method of claim 24, wherein the first adhesive is inserted into the channel with the aid of a needle on an application device.

26. The method of claim 18, wherein more than two functional layers are adhesively bonded with one another, and wherein the hardening of the second adhesive by heat takes place only after all the functional layers have been fixed with the aid of the UV-hardening first adhesive.

27. The method of claim 17, wherein at least one of the following layers from the following list is used as a functional layer:
scintillator layer,
photosensor layer,
readout electronics layer,
substrate layer, and
carrier layer.

28. The method of claim 17, wherein at least one channel has both the first adhesive and a second adhesive.

29. The method of claim 18, wherein at least one of the first adhesive and the second adhesive is inserted with the aid of an application device as a bead into the channel.

30. The method of claim 29, wherein at least one of the first adhesive and the second adhesive is inserted with the aid of a multi-chamber application device as parallel beads into the channel.

31. The method of claim 18, wherein at least one of the first adhesive and the second adhesive is inserted into the channel before the sandwich-like structure including the first functional layer and the second functional layer is formed.

32. The method as claimed in claim 18, wherein at least one of the first adhesive and the second adhesive is inserted into the channel after the sandwich-like structure including the first functional layer and the second functional layer is formed.

33. The method of claim 32, wherein at least one of the first adhesive and the second adhesive is inserted into the channel with the aid of a needle on an application device.

* * * * *